(12) United States Patent
Prakash et al.

(10) Patent No.: US 11,973,414 B2
(45) Date of Patent: Apr. 30, 2024

(54) DECOUPLED PCB STRUCTURE TO PARALLEL POWER TRANSISTORS

(71) Applicant: SCHNEIDER ELECTRIC IT CORPORATION, Foxboro, MA (US)

(72) Inventors: Indra Prakash, Bangalore (IN); Roger Franchino, Meylan (FR); Damir Klikic, Waltham, MA (US)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 586 days.

(21) Appl. No.: 17/159,927

(22) Filed: Jan. 27, 2021

(65) Prior Publication Data

US 2021/0242767 A1 Aug. 5, 2021

(30) Foreign Application Priority Data

Jan. 31, 2020 (IN) .............................. 202011004303

(51) Int. Cl.
| | | |
|---|---|---|
| H02M 1/08 | (2006.01) | |
| H02M 7/00 | (2006.01) | |
| H02M 7/537 | (2006.01) | |
| H05K 1/02 | (2006.01) | |
| H05K 1/18 | (2006.01) | |
| H05K 3/32 | (2006.01) | |

(52) U.S. Cl.
CPC ............. *H02M 1/08* (2013.01); *H02M 7/003* (2013.01); *H02M 7/537* (2013.01); *H05K 1/0298* (2013.01); *H05K 1/181* (2013.01); *H05K 3/32* (2013.01); *H05K 2201/09227* (2013.01); *H05K 2201/10015* (2013.01); *H05K 2201/10166* (2013.01); *H05K 2201/10522* (2013.01)

(58) Field of Classification Search
CPC ........ H02M 1/08; H02M 7/003; H02M 7/537; H05K 1/0298; H05K 1/181; H05K 3/32; H05K 2201/09227; H05K 2201/10015; H05K 2201/10166; H05K 2201/10522
USPC ........................................................ 363/131
See application file for complete search history.

(56) References Cited

U.S. PATENT DOCUMENTS

| 9,331,061 B2 | 5/2016 | De Rooij et al. |
| 2013/0049814 A1* | 2/2013 | De Rooij ............ H01L 27/0207 438/149 |

(Continued)

OTHER PUBLICATIONS

Extended European Search Report from corresponding European Application No. 21153942.4 dated Jun. 11, 2021.

*Primary Examiner* — Yemane Mehari
(74) *Attorney, Agent, or Firm* — Lando & Anastasi, LLP

(57) ABSTRACT

According to one aspect, embodiments of the invention provide an electrical-converter system comprising a printed circuit board including at least a first layer and a second layer, a switching node disposed on the second layer, a first transistor, a second transistor, a third transistor, and a fourth transistor disposed on the first layer, a first conduction path from a source of the first transistor, through the switching node, to a drain of the fourth transistor, the first conduction path having a first length, and a second conduction path from the source of the first transistor, through the switching node, to a drain of the second transistor, the second conduction path having a second length, wherein the first length of the first conduction path is greater than the second length of the second conduction path.

23 Claims, 8 Drawing Sheets

(56) References Cited

U.S. PATENT DOCUMENTS

2016/0322910 A1* 11/2016 Kovacevic ........ H02M 3/33576
2018/0191235 A1* 7/2018 Chen .................. H01F 27/2804

* cited by examiner

DECOUPLED PCB STRUCTURE TO PARALLEL POWER TRANSISTORS

CROSS-REFERENCE TO RELATED APPLICATION

This application claims the benefit under 35 U.S.C. § 119 of Indian Patent Application No. 202011004303 filed on Jan. 31, 2020 which is hereby incorporated herein by reference in its entirety for all purposes.

BACKGROUND

1. Field of Invention

Embodiments of the invention relate generally to power conversion, and more particularly, to parallel power switching devices used for power conversion.

2. Discussion of Related Art

The use of power devices, such as uninterruptible power supplies (UPS), to provide regulated, uninterrupted power for sensitive and/or critical loads, such as computer systems and other data processing systems, is known. UPS's typically include various types of power converters for converting AC power to DC power, DC power to AC power, and DC power from one voltage level to another. These various power converters can include power switching circuits utilizing various types of switching devices, such as Field Effect Transistors (FETs), High Electron Mobility Transistors (HEMTs), Bipolar Junction Transistors (BJTs), and Insulated-Gate Bipolar Transistors (IGBTs).

SUMMARY

At least one aspect of the invention is directed to an electrical-converter system, comprising: a printed circuit board including at least a first layer and a second layer, a switching node disposed on the second layer, a first transistor, a second transistor, a third transistor, and a fourth transistor disposed on the first layer, the first transistor and the third transistor each having a source coupled to the switching node, and the second transistor and the fourth transistor each having a drain coupled to the switching node, a first conduction path from the source of the first transistor, through the switching node, to the drain of the fourth transistor, the first conduction path having a first length, and a second conduction path from the source of the first transistor, through the switching node, to the drain of the second transistor, the second conduction path having a second length, wherein the first length of the first conduction path is greater than the second length of the second conduction path.

In one embodiment, the electrical-converter system includes a third conduction path from the source of the third transistor, through the switching node, to the drain of the second transistor, the third conduction path having a third length, and a fourth conduction path from the source of the third transistor, through the switching node, to the drain of the fourth transistor, the fourth conduction path having a fourth length, wherein the third length of the third conduction path is greater than the fourth length of the fourth conduction path.

In some embodiments, the transistors are positioned on the first layer symmetrically such that a first distance between the first and second transistors is substantially the same as second distance between the third and fourth transistors, and a third distance between the first and third transistors is substantially the same as a fourth distance between the second and fourth transistors. In certain embodiments, the first length of the first conduction path is substantially the same as the third length of the third conduction path and the second length of the second conduction path is substantially the same as the fourth length of the fourth conduction path.

In various embodiments, the electrical-converter system includes a plurality of gate drive outputs and a plurality of gate drive conduction paths between the plurality of gate drive outputs and gates of the first, second, third, and fourth transistors, wherein each of the plurality of gate drive conduction paths has substantially the same length.

In one embodiment, the electrical-converter system includes a positive bus and a negative bus disposed on the first layer, wherein a drain of the first transistor and a drain of the third transistor are coupled to the positive bus and a source of the second transistor and a source of the fourth transistor are coupled to the negative bus. In some embodiments, the electrical-converter system includes a plurality of decoupling capacitors coupled between the positive bus and the negative bus and disposed on the first layer between the transistors and above the switching node.

In certain embodiments, each of the transistors are Gallium Nitride (GaN) power transistors. In some embodiments, the GaN power transistors are provided in one of a through-hole device package and a surface mount device package.

Another aspect of the invention is directed to an electrical-converter system, comprising: a printed circuit board including at least a first layer and a second layer, a switching node disposed on the second layer, a first transistor, a second transistor, a third transistor, and a fourth transistor disposed on the first layer, the first transistor and the third transistor each having a source coupled to the switching node, and the second transistor and the fourth transistor each having a drain coupled to the switching node, a first conduction path from the source of the first transistor, through the switching node, to the drain of the fourth transistor, the first conduction path having a first inductance, and a second conduction path from the source of the first transistor, through the switching node, to the drain of the second transistor, the second conduction path having a second inductance, wherein the first inductance of the first conduction path is greater than the second inductance of the second conduction path.

In one embodiment, the electrical-converter system includes a third conduction path from the source of the third transistor, through the switching node, to the drain of the second transistor, the third conduction path having a third inductance, a fourth conduction path from the source of the third transistor, through the switching node, to the drain of the fourth transistor, the fourth conduction path having a fourth inductance, wherein the third inductance of the third conduction path is greater than the fourth inductance of the fourth conduction path.

In some embodiments, the transistors are positioned on the first layer symmetrically such that a first distance between the first and second transistors is substantially the same as a second distance between the third and fourth transistors, and a third distance between the first and third transistors is substantially the same as a fourth distance between the second and fourth transistors. In certain embodiments, the first inductance of the first conduction path is substantially the same as the third inductance of the third conduction path and the second inductance of the second conduction path is substantially the same as the fourth inductance of the fourth conduction path.

In various embodiments, the electrical-converter system includes a plurality of gate drive outputs and a plurality of gate drive conduction paths between the plurality of gate drive outputs and gates of the first, second, third, and fourth transistors, wherein each of the plurality of gate drive conduction paths have substantially the same length.

In one embodiment, the electrical-converter system includes a positive bus and a negative bus disposed on the first layer, wherein a drain of the first transistor and a drain of the third transistor are coupled to the positive bus and a source of the second transistor and a source of the fourth transistor are coupled to the negative bus. In some embodiments, the electrical-converter system includes a plurality of decoupling capacitors coupled between the positive bus and the negative bus and disposed on the first layer between the transistors and above the switching node.

In certain embodiments, each of the transistors are Gallium Nitride (GaN) power transistors. In some embodiments, the GaN power transistors are provided in one of a through-hole device package and a surface mount device package.

Another aspect of the invention is directed to a method for manufacturing an electrical-converter system, the method comprising: providing a printed circuit board having at least a first layer and a second layer with a switching node disposed on the second layer, arranging a first transistor, a second transistor, a third transistor, and a fourth transistor on the first layer of the printed circuit board in proximity to the switching node, and coupling a source of the first transistor, a drain of the second transistor, a source of the third transistor, and a drain of the fourth transistor to the switching node such that a first length of a first conduction path from the source of the first transistor, through the switching node, to the drain of the fourth transistor is greater than a second length of a second conduction path from the source of the first transistor, through the switching node, to the drain of the second transistor.

In one embodiment, the method includes arranging a plurality of decoupling capacitors on the first layer between the transistors and above the switching node. In some embodiments, the method includes coupling the decoupling capacitors between a positive bus and a negative bus disposed on the first layer.

In certain embodiments, arranging the transistors on the first layer further includes positioning the transistors symmetrically such that a first distance between the first and second transistors is substantially the same as a second distance between the third and fourth transistors, and a third distance between the first and third transistors is substantially the same as a fourth distance between the second and fourth transistors.

In some embodiments, the method includes coupling gates of the first, second, third, and fourth transistors to a plurality of gate driver outputs such that the length of each conduction path between the plurality of gate driver outputs and the transistor gates is substantially the same.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments and are incorporated in and constitute a part of this specification but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

As discussed above, power devices, such as uninterruptible power supplies (UPS), may be used to provide regulated, uninterrupted power to sensitive and/or critical loads. An online UPS rectifies input AC power provided by an electric utility using a Power Factor Correction converter circuit (PFC) to provide DC power to at least one DC bus. The rectified DC power on the DC bus(es) may be used to charge a battery while mains power is available. In the absence of mains power, the battery discharges and provides DC power to the DC bus(es). From the DC power on the DC bus(es), an inverter generates an AC output voltage that is provided to a load. Since power is provided to the DC bus(es) from either mains or the battery, the output power of the UPS is uninterrupted if the mains fails and the battery is sufficiently charged. Online UPS's may also operate in a bypass mode where unconditioned power with basic protection is provided directly from an AC power source to a load via a bypass line.

Figure 1:
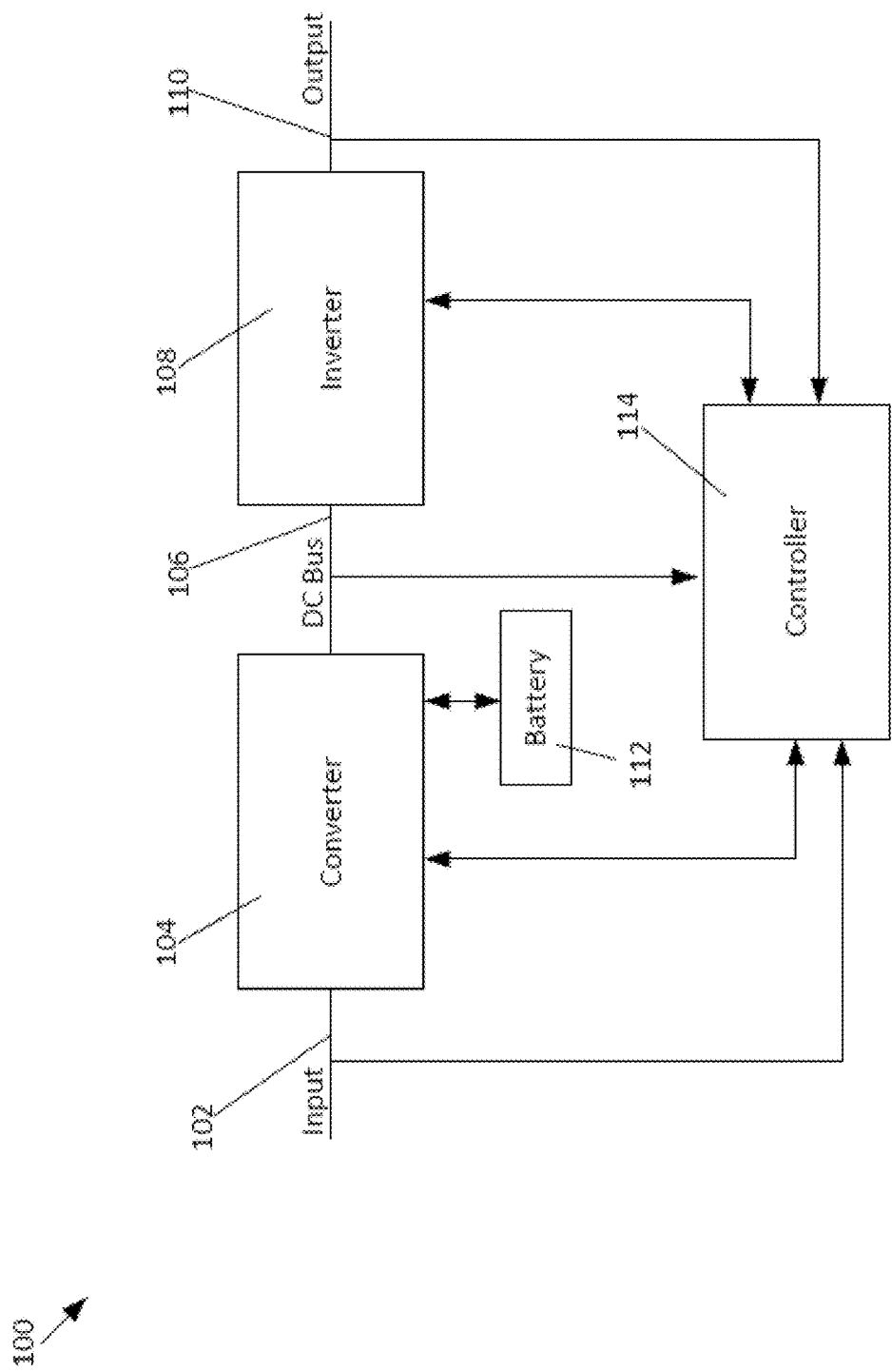
FIG. 1 is a functional block diagram of an uninterruptible power supply in accordance with one embodiment of the present invention.

FIG. 1 is a block diagram of one embodiment of a UPS 100 that provides regulated power from input AC power received at an input 102, as well as back-up power from a battery 112, to an output 110. The UPS 100 includes a converter 104, a DC bus 106, an inverter 108, and a controller 114 for controlling the converter and the inverter. The converter 104 is coupled to the input 102, the inverter 108 is coupled to the output 110, and the DC bus 106 is coupled between the converter 104 and the inverter 108.

The input 102 is configured to receive input AC power having an input voltage level from an AC power source. The controller 114 monitors the input AC power received by the input 102 and is configured to operate the UPS 100 in different modes of operation based on the status of the input AC power received by the input 102. When AC power provided to the input 102 is acceptable (i.e., above an input power threshold), the controller 114 operates the UPS 100 in an online mode of operation.

In the online mode of operation, AC power from the input 102 can be provided to the converter 104. According to one embodiment, the converter 104 is a Power Factor Correction (PFC) converter 104; however, in other embodiments, other types of converters may be utilized. The controller 114 operates the converter 104 to convert the AC power into DC power and provide the DC power to the DC bus 106. DC power from the DC bus 106 is provided to the inverter 108. In addition, DC power from the DC bus 106 may be provided to the battery 112 for charging, either directly from the converter 104 or via a DC/DC converter. The controller 114 operates the inverter 108 to convert the DC power into regulated AC power and provide the regulated AC power to a load coupled to the output 110.

When AC power provided to the input 102 is not acceptable (i.e., below an input power threshold), the controller 114 operates the UPS 100 in a backup mode of operation. In the backup mode of operation, DC power from the battery 112 is provided to the DC bus 106, either directly or via a DC/DC converter. The inverter 108 receives the DC power from the DC bus 106, and the controller 114 operates the inverter 108 to convert the DC power from the DC bus 106 into regulated AC power and provide the regulated AC power to the output 110.

As described above, a UPS can include various types of power converters for converting AC power to DC power, DC power to AC power, and DC power from one DC voltage level to another. These various power converters are known to include power switching circuits utilizing switching devices such as Field-Effect Transistors (FETs), High Electron Mobility Transistors (HEMTs), Bipolar Junction Transistors (BJTs), and Insulated-Gate Bipolar Transistors (IGBTs). Gallium Nitrate (GaN) is a common wide-bandgap material used in the fabrication of such switching devices for power switching applications. In some examples, GaN FETs can offer high switching speeds, and thus reduce switching losses, enabling high frequency power converter designs. In addition, GaN FETs can experience low on-resistance at high voltages, even at high temperatures.

In power-switching applications, voltage and current may be switched through GaN devices at a high rate to reduce switching losses. In some examples, this high rate of change in combination with parasitic capacitances and inductances associated with the GaN devices and/or printed-circuit boards (PCB) may generate current oscillations and/or voltage overshoots. These current oscillations and voltage overshoots can impair or damage the GaN devices, and in some cases may eventually lead to failure of the GaN devices.

The limitations discussed above can increase significantly when two or more GaN devices are configured in parallel to increase the power rating of power converters. In some examples, power switching circuits including parallel GaN devices may be subject to increased parasitic capacitances and inductances which can lead to severe electromagnetic interference, current oscillations, voltage overshoots, and an uneven dynamic sharing of current between the GaN devices.

Some approaches for mitigating issues associated with paralleled GaN devices include adding passive components, such as ferrite beads and RC snubbers, to suppress oscillations and overshoots. However, ferrite beads connected in series with the GaN devices can introduce additional inductance into signal paths, and RC snubbers can lead to additional losses and reduce performance in high speed applications. In addition, such components can often lead to manufacturing issues and may reduce the reliability of power converters. For example, such components (e.g., toroidal ferrite beads) may be easily damaged during manufacturing by drops and/or vibrations.

A more efficient and reliable PCB structure for parallel GaN devices is provided herein. In at least one embodiment, parallel GaN devices are arranged such that each switching leg of a power switching circuit maintains an independent conduction path. In some examples, maintaining independent conduction paths for each switching leg of the power switching circuit can enable maximum dynamic current sharing between the parallel GaN devices while reducing voltage overshoots and current oscillations, and improving the efficiency of the power switching circuit.

Figure 2:
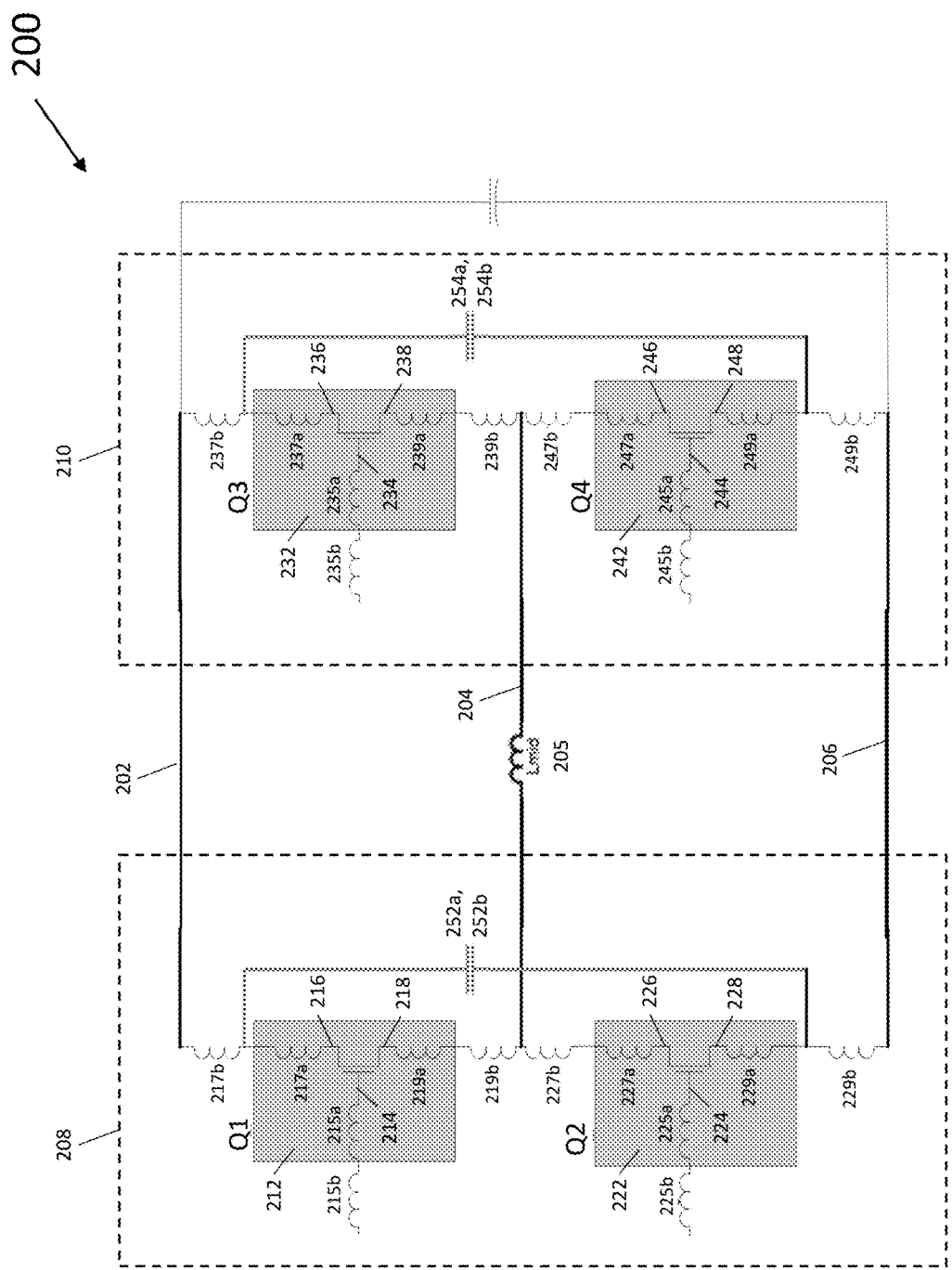
FIG. 2 is a schematic of a power switching circuit in accordance with one embodiment of the present invention.

FIG. 2 is a schematic of one example of a power switching circuit 200 in accordance with aspects described herein. In one example, the power switching circuit 200 may be configured as a half-bridge inverter. The power switching circuit 200 may be used, for example, in an inverter in a UPS (e.g., the inverter 108 of the UPS 100 shown in FIG. 1). In other examples, the power switching circuit 200 may be configured as a half-bridge converter and used in a converter in a UPS (e.g., the converter 104 of the UPS 100 shown in FIG. 1).

As shown in FIG. 2, the power switching circuit 200 includes a positive bus 202, a switching node 204, a negative bus 206, a first switching leg 208, and a second switching leg 210 in parallel with the first switching leg 208; however, in other examples the power switching circuit 200 may include three or more parallel switching legs. The first switching leg 208 includes a first GaN device 212 having a drain 216 coupled to the positive bus 202 and a source 218 coupled to the switching node 204, and a second GaN device 222 having a drain 226 coupled to the switching node 204 and a source 228 coupled to the negative bus 206. The second switching leg 210 includes a third GaN device 232 having a drain 236 coupled to the positive bus 202 and a source 238 coupled to the switching node 204, and a fourth GaN device 242 having a drain 246 coupled to the switching node 204 and a source 248 coupled to the negative bus 206. In this context, "drain" may refer to any device terminal at which current enters the device. Likewise, "source" may refer to any device terminal at which current exits the device. As shown in FIG. 2, the first GaN device 212 is coupled in parallel with the third GaN device 232 between the positive bus 202 and the switching node 204. Likewise, the second GaN device 222 is coupled in parallel with the fourth GaN device 242 between the negative bus 206 and the switching node 204.

As discussed above, power switching circuits can be used in high power applications by sharing current between paralleled GaN devices. In one example, current on the positive bus 202 and the negative bus 206 may be shared between the first switching leg 208 and the second switching leg 210, and the switching legs may be operated in unison. For example, in a first state of the of the power switching circuit 200, the first GaN device 212 and the third GaN device 232 may be turned on to couple the positive bus 202 to the switching node 204, and in a second state of the power switching circuit 200, the second GaN device 222 and the fourth GaN device 242 may be turned on to couple the negative bus 206 to the switching node 204.

In some examples, the first switching leg 208 may include a first decoupling capacitor 252a and a second decoupling capacitor 252b coupled between the positive bus 202 and the negative bus 206 to provide local stable DC voltages to the first GaN device 212 and the second GaN device 222. Likewise, the second switching leg 210 may include a third decoupling capacitor 254a and a fourth decoupling capacitor 254b coupled between the positive bus 202 and the negative bus 206 to provide local stable DC voltages to the third GaN device 232 and the fourth GaN device 242. In other examples, a different number of decoupling capacitors may be used.

In some examples, each of the GaN devices 212, 222, 232, and 242 may be subject to various parasitic inductances. For example, each of the GaN devices 212, 222, 232, and 242 may be enclosed in a device package, such as a through-hole package, surface mount package, etc. As such, each device terminal (i.e., gate, drain, source) may have an associated package parasitic inductance. In some examples, the package parasitic inductance associated with each device terminal may correspond to connections (e.g., wire bonds) from a device substrate or die to package pins and/or leads. As shown in FIG. 2, the first GaN device 212 may have a package parasitic gate inductance 215a, a package parasitic drain inductance 217a, and a package parasitic source inductance 219a. Similarly, the second GaN device 222 may have package parasitic inductances 225a, 227a, 229a, the third GaN device 232 may have package parasitic inductances 235a, 237a, 239a, and the fourth GaN device 242 may have package parasitic inductances 245a, 247a, 249a.

In one example, the GaN devices 212, 222, 232, and 242 may be arranged on a printed-circuit board (PCB) and connected via electrical traces and/or planes included on or within the PCB. As such, in addition to package parasitic inductances, each device terminal of the GaN devices may have an associated PCB parasitic inductance. In some examples, the PCB parasitic inductance associated with each GaN device terminal may correspond to the inductance of an electrical trace or traces coupled to each device terminal. In certain examples, the PCB parasitic inductance associated with each device terminal may also include an inductance of a terminal pin, lead, or pad electrically and physically coupled to the PCB.

As shown in FIG. 2, the first GaN device 212 may have a PCB parasitic gate inductance 215b, a PCB parasitic drain inductance 217b, and a PCB parasitic source inductance 219b. Similarly, the second GaN device 222 may have a PCB parasitic gate inductance 225b, a PCB parasitic drain inductance 227b, and a PCB parasitic source inductance 239b inductance, the third GaN device 232 may have a PCB parasitic gate inductance 235b, a PCB parasitic drain inductance 237b, and a PCB parasitic source inductance 239b, and the fourth GaN device 242 may have a PCB parasitic gate inductance 245b, a PCB parasitic drain inductance 247b, and PCB parasitic source inductance 249b.

In one example, the PCB parasitic source inductance 219b of the first GaN device 212 and the PCB parasitic drain inductance 227b of the second GaN device 222 may correspond to the inductance of a conduction path between the first GaN device 222 through the switching node 204 to the second GaN device 222. Likewise, the PCB parasitic source inductance 239b of the third GaN device 232 and the PCB parasitic drain inductance 247b of the fourth GaN device 242 may correspond to a conduction path between the third GaN device 232 and the fourth GaN device 242. In some examples, the PCB parasitic inductances of the GaN devices and the parasitic midpoint inductance 205 may correspond to the inductance of switching paths between GaN devices of the first switching leg 208 and the GaN devices of the second switching leg 210. For example, the inductance of a conduction path from the first GaN device 212 through the switching node 204 to the fourth GaN device 242 may include the PCB parasitic source inductance 219b of the first GaN device 212, the PCB parasitic midpoint inductance 205, and the PCB parasitic drain inductance 247b of the fourth GaN device 242.

Figure 3A:
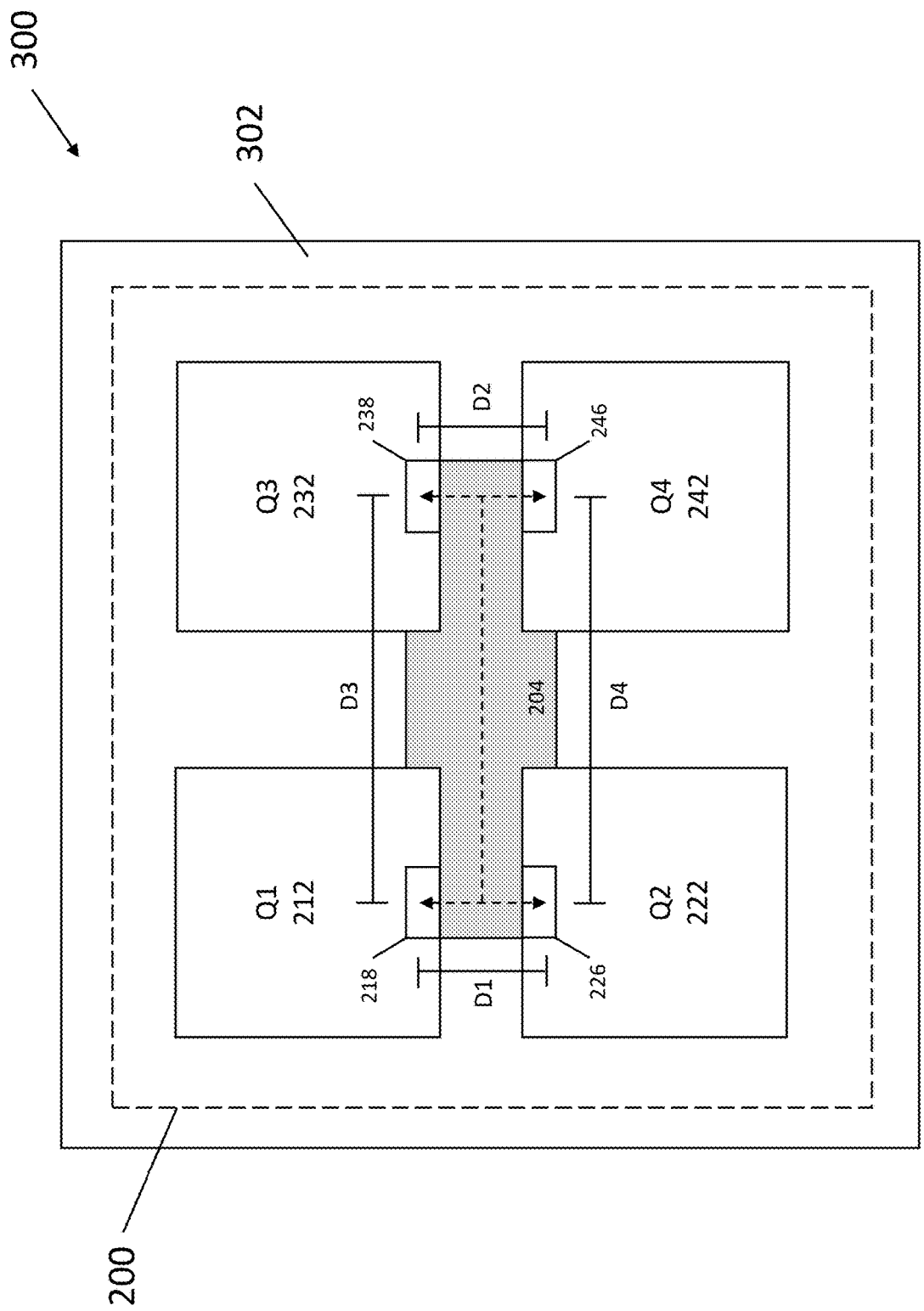
FIG. 3A is a diagram of a power switching assembly in accordance with one embodiment of the present invention.

FIG. 3A is a diagram illustrating an example of a power switching assembly 300 including the power switching circuit 200 arranged on a PCB 302. In one example, the PCB 302 may be a multi-layer PCB. In some examples, the GaN devices and the switching node 204 may be disposed on different layers of the PCB 302. For example, the GaN devices 212, 222, 232, and 242 may be disposed on a first layer and the switching node 204 may be disposed on a second layer, or any other layer. In one example, the GaN devices may be positioned on the first layer above the switching node 204. In other examples, the GaN devices may be positioned on the first layer such that each GaN device at least partially overlaps with the switching node 204. In one example, the switching node 204 may have a rectangular shape as shown in FIG. 3A; however, in other examples the switching node 204 may have a different shape.

As shown in FIG. 3A, a first distance D1 corresponds to the distance between the source 218 of the first GaN device 212 and the drain 226 of the second GaN device 222 and a second distance D2 corresponds to the distance between the source 238 of the third GaN device 232 and the drain 246 of the fourth GaN device 242. Likewise, a third distance D3 corresponds to the distance between the source 218 of the first GaN device 212 and the source 238 of the third GaN device 232 and a fourth distance D4 corresponds to the distance between the drain 226 of the second GaN device 222 and the drain 246 of the fourth GaN device 242.

As discussed above, the GaN devices of first switching leg 208 (i.e., 212, 222) and the GaN devices of the second inverter leg 210 (i.e., 232, 242) may be operated in unison. As such, the efficiency of the power switching circuit 200 can be improved by maintaining independent conduction paths for each of the switching legs to achieve maximum dynamic current sharing. For example, maximum dynamic current sharing may be achieved by preventing current from commutating between GaN devices of different inverter legs; i.e., allowing current from the first GaN device 212 to only commutate through the second GaN device 222 and allowing current from the third GaN device 232 to only commutate through the fourth GaN device 242, and vice versa.

In some examples, the independent conduction paths for each switching leg may be established by adjusting the distances D1-D4 between the GaN devices 212, 222, 232, and 242. For example, the GaN devices may be arranged such that the first distance D1 between the first GaN device 212 and the second GaN device 222 of the first switching leg 208 is less than the distance between the first switching leg 208 and the second switching leg 210 (i.e., D3 and D4). In addition, the GaN devices may be arranged such that the second distance D2 between the third GaN device 232 and the fourth GaN device 242 is also less than the distance between the first switching leg 208 and the second switching leg 210 (i.e., D3 and D4). In one example, the GaN devices may be arranged such that the distances between GaN devices of the same switching leg are less than the distances between GaN devices of different switching legs coupled diagonally across the switching node 204. For example, the distances D1-D4 may be adjusted such that the distances D1 and D2 are less than both the distance between the first GaN device 212 and the fourth GaN device 242 and the distance between the second GaN device 222 and the third GaN device 232. In one example, the GaN devices may be arranged symmetrically such that D1 is substantially the same as D2 and D3 is substantially the same as D4. For example, in certain examples, the GaN devices may be arranged such that D1 and D2 have less than a 10% mismatch. In some examples, the GaN devices may be arranged such that the distances D3 and D4 are at least 20-30% larger than the distances D1 and D2.

Being that each of the GaN devices 212, 222, 232, and 242 have at least one device terminal coupled to the switching node 204, the distances D1-D4 may correspond to lengths of conduction paths between the GaN devices. For example, by minimizing D1 relative to D3 and D4, the length of the conduction path from the source 218 of the first GaN device 212 through the switching node 204 to the drain 226 of the second GaN device 222 may be shorter than the length of conduction paths from either of the GaN devices 212, 222 to the GaN devices of the second switching leg 210 (i.e., 232, 242). Likewise, by minimizing D2 relative to D3 and D4, the length of the conduction path from the source 238 of the third GaN device 232 through the switching node 204 to the drain 246 of the fourth GaN device 242 may be shorter than the length of conduction paths from either of the GaN devices 232, 242 to the GaN devices of the first switching leg 208 (i.e., 212, 222). In other words, the conduction paths between GaN devices of the same switching leg (e.g., 208 or 210) may be shorter than the conduction paths between the GaN devices of the first switching leg 208 and the GaN devices of the second switching leg 210.

In one example, the length of each conduction path may affect the inductance of each conduction path; i.e., short conduction paths may have lower inductance and long conduction paths may have higher inductance. As such, the inductance of the conduction path between the source 218 of the first GaN device 212 and the drain 226 of the second GaN device 222 may be lower than the inductance of conduction paths from either of the GaN devices 212 and 222 to the GaN devices of the second switching leg 210 (i.e., 232, 242). Similarly, the inductance of the conduction path between the source 238 of the third GaN device 232 and the drain 246 of the fourth GaN device 242 may be lower than the inductance of conduction paths from either of the GaN devices 232 and 242 to the GaN devices of the first switching leg 208 (i.e., 212, 222).

In some examples, being that the conduction paths between GaN devices of the same switching leg have a lower inductance than the conduction paths between GaN devices of different switching legs, the first switching leg 208 and the second switching leg 210 may each maintain independent conduction paths. For example, current carried by the first switching leg 208 may commutate between the first GaN device 212 and the second GaN device 222 and current carried by the second switching leg 210 may commutate between the third GaN device 232 and the fourth GaN device 242.

Figure 3B:
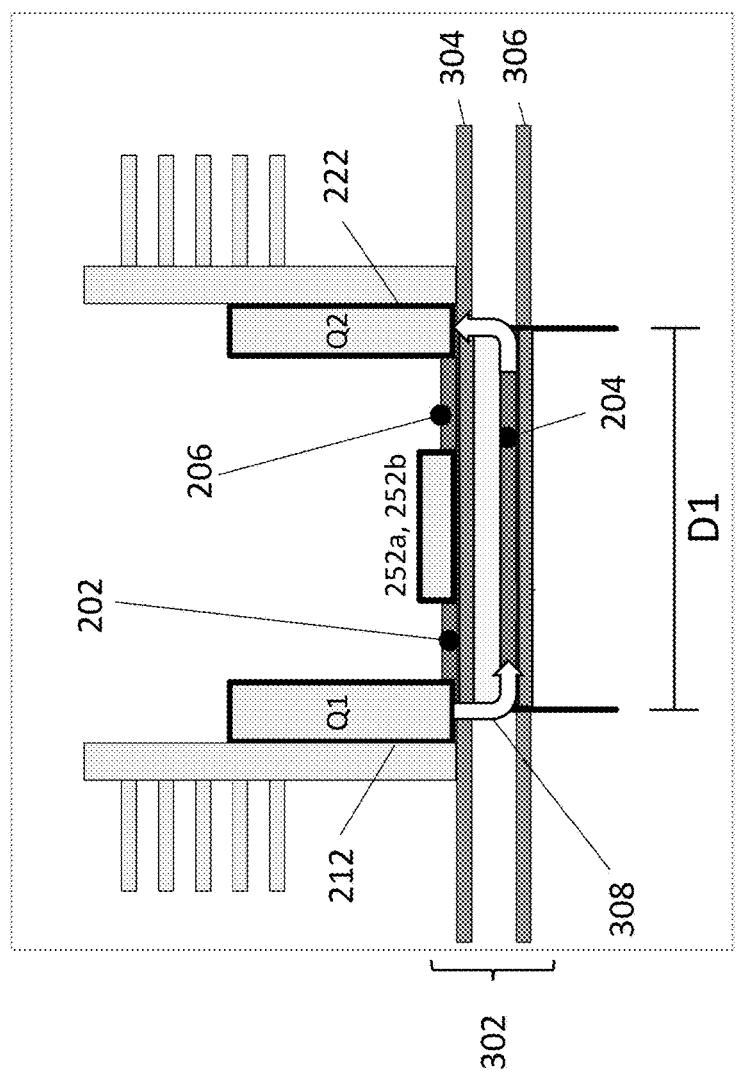
FIG. 3B is a diagram of a power switching assembly in accordance with one embodiment of the present invention.

FIG. 3B illustrates a side-view of the power switching assembly 300 (showing the first switching leg 208 only). As discussed above, the first GaN device 212 and the second GaN device 222 may be arranged on a first (i.e., top) layer 304 of the PCB 302 and the switching node 204 may be disposed on a second layer 306 of the PCB 302. In addition, the decoupling capacitors 252a, 252a of the first switching leg 208 and the decoupling capacitors 254a, 254b of the second switching leg 210 may be disposed on the first layer 304 between the GaN devices and above the switching node 204.

An example of a first conduction path between the first GaN device 212 and the second GaN device 222 is generally indicated at 308. As shown, the length of the first conduction path 308 corresponds to the distance D1 between the source 218 of the first GaN device 212 and the drain 226 of the second GaN device 222. As discussed above, by minimizing the distance D1, the length of the first conduction path 308 can be minimized, and the first conduction path 308 may have a lower inductance than conduction paths between the GaN devices 212, 222 of the first switching leg 208 and the GaN devices 232, 242 of the second switching leg 210. As such, current from the first GaN device 212 may commutate via the first conduction path 308 to the second GaN device 222, and vice versa. Likewise, by minimizing the distance D2, the inductance of a second conduction path (not shown) between the GaN devices 232, 242 of the second switching leg 210 can be minimized such that current from the third GaN device 232 commutates via the second conduction path to the fourth GaN device 242, and vice versa.

Figure 4A:
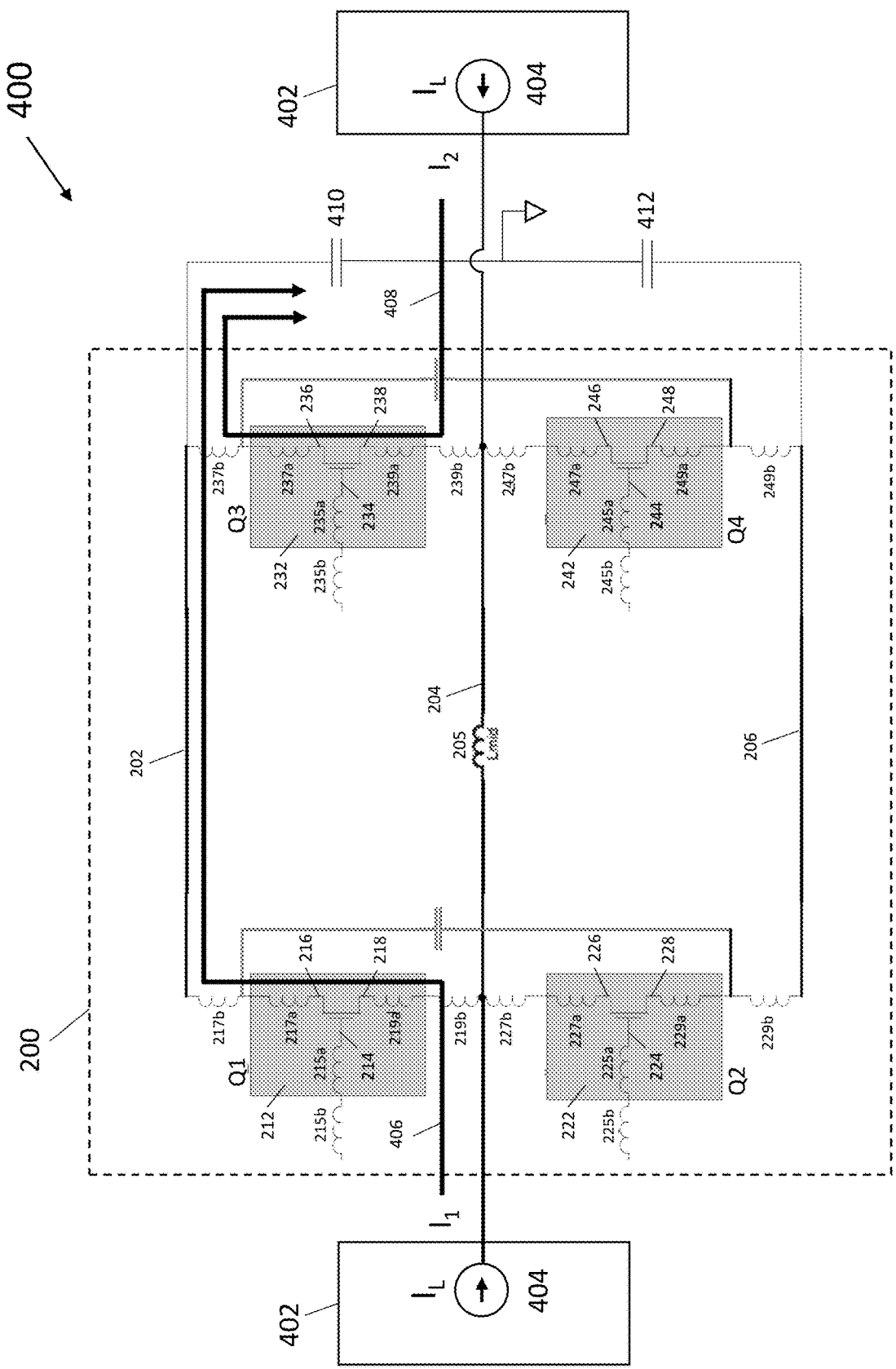
FIG. 4A is a diagram of a power switching application in accordance with one embodiment of the present invention.
Figure 4B:
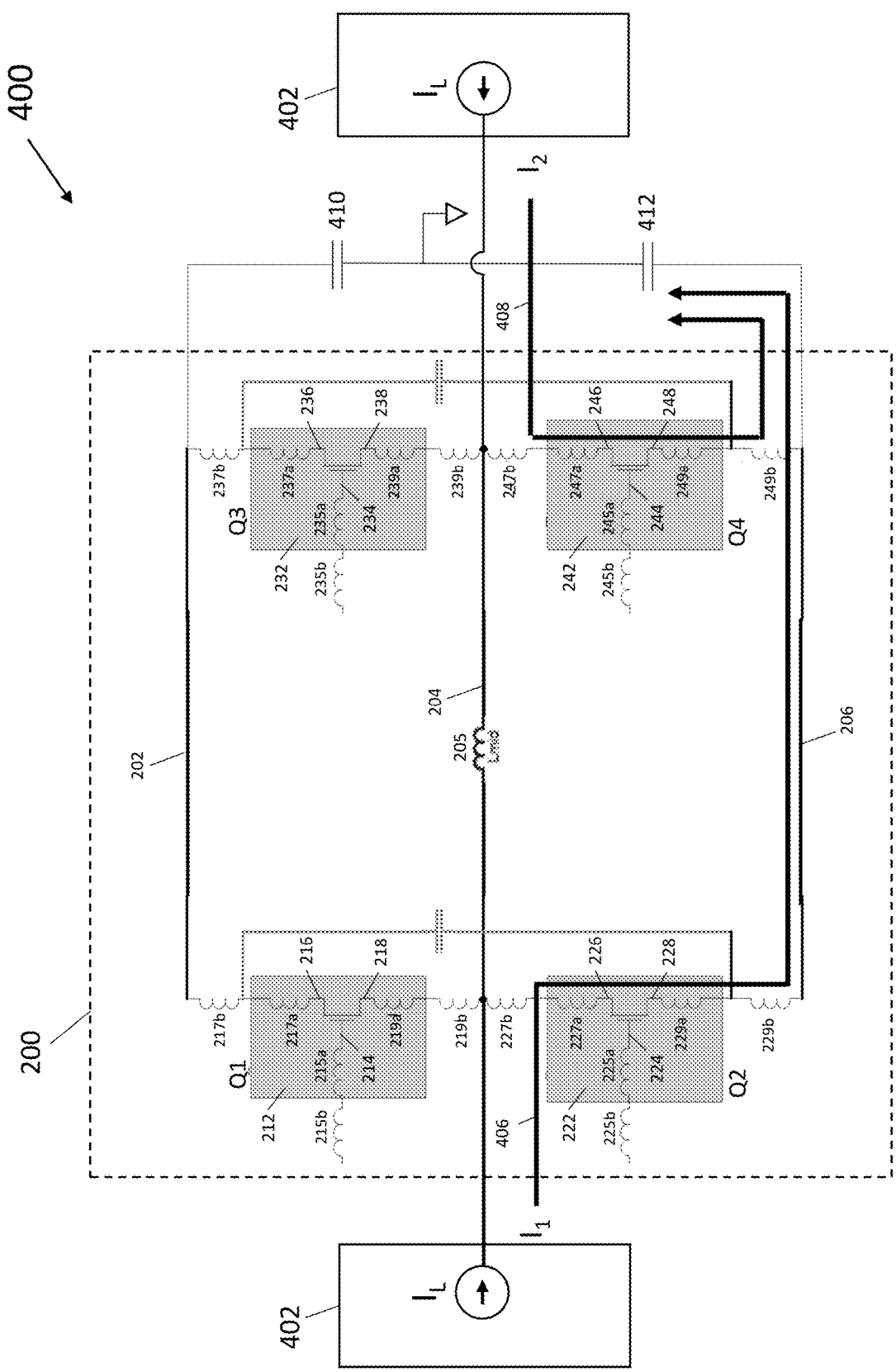
FIG. 4B is a diagram of a power switching application in accordance with one embodiment of the present invention.

FIGS. 4A and 4B illustrate a power switching application 400 including the power switching circuit 200. In one example, the power switching application 400 may correspond to the operation of power switching circuitry used in an AC-to-DC converter of a UPS (e.g., the converter 104 of the UPS 100 shown in FIG. 1). In other examples, the power switching application 400 may correspond to the operation of power switching circuitry used in a DC-to-AC inverter of a UPS (e.g., the inverter 108 of the UPS 100 shown in FIG. 1). In some examples, the power switching application 400 may correspond to the operation of power switching circuitry used in a DC-to-DC converter of a UPS.

In one example, the power switching circuit 200 is arranged in the power switching assembly 300 as shown in FIGS. 3A and 3B. As shown in FIGS. 4A and 4B, the switching node 204 is coupled to a load 402 having a load current 404. In one example, the switching node 204 is coupled to the load 402 between the GaN devices of the first switching leg 208 and the second switching leg 210. In some examples, the load 402 may be coupled to the device terminal of each GaN device coupled to the switching node 204. For example, the source 218 of the first GaN device 212 and the drain 226 of the second GaN device 222 may each be coupled to the switching node 204 and the load 402. Likewise, the source 238 of the third GaN device 232 and the drain 246 of the fourth GaN device 242 may each be coupled to the switching node 204 and the load 402.

FIGS. 4A and 4B illustrate the power switching circuit 200 in the power switching application 400 while transitioning from the first state to the second state. As discussed above, the first state of the power switching circuit 200 may include turning on the first GaN device 212 of the first switching leg 208 and the third GaN device 232 of the second switching leg 210 to couple the positive bus 202 to the switching node 204. Similarly, the second state of the power switching circuit 200 may include turning on the second GaN device 222 of the first switching leg 208 and the fourth GaN device 242 of the second switching leg 210. In some examples, the first switching leg 208 may carry a first portion of the load current 404, e.g., first load current 406, and the second switching leg 210 may carry a second portion of the load current 404; e.g., second load current 408.

To transition from the first state to the second state, the first GaN device 212 and the third GaN device 232 are turned off and the second GaN device 222 and the fourth GaN device 242 are turned on. In FIG. 4A, the first GaN device 212 and the third GaN device 232 have been turned off and are carrying the load current 402 in a reverse direction (i.e., source to drain) to a positive bus capacitor 406. In one example, each GaN device may have a similar positive temperature coefficient, and therefore a substantially similar on resistance. As such, static current (e.g., the load current 402 as shown in FIG. 4A) may be shared equally between the first switching leg 208 and the second switching leg 210; i.e., the first load current 406 and the second load current 408 may be substantially equal portions of the load current 402.

FIG. 4B illustrates the power switching circuit 200 after the second GaN 222 and the fourth GaN device 242 have been turned on. As discussed above, the conduction path between the first GaN device 212 and the second GaN device 222 may have a lower inductance than conduction paths including the PCB parasitic midpoint inductance 205 (e.g., conduction paths from the first switching leg 208 to the second switching leg 210). As such, when transitioning the power switching circuit 200 from the first state to the second state, the first load current 406 may commutate from the first GaN device 212 to the second GaN device 222 and the second GaN device 222 may begin to carry the first load current 406 in a forward direction (i.e., drain to source). Likewise, the conduction path between the third GaN device 232 and the fourth GaN device 242 may have a lower inductance than conduction paths including the PCB parasitic midpoint inductance 205 (e.g., conduction paths from the second switching leg 210 to the first switching leg 208). When transitioning the power switching circuit 200 from the first state to the second state, the second load current 408 may commutate from the third GaN device 232 to the fourth GaN device 242 and the fourth GaN device 242 may begin to carry the second load current 408 in the forward direction. As such, during a transition of the power switching circuit 200, dynamic current may be shared equally between the first switching leg 208 and the second switching leg 210; i.e., the first load current 406 and the second load current 408 may remain substantially equal portions of the load current 402. Similarly, when transitioning the power switching circuit 200 from the second state back to the first state, the first load current 406 may commutate from the second GaN device 222 to the first GaN device 212 and the second load current 408 may commutate from the fourth GaN device 242 to the third GaN device 232.

By establishing independent conduction paths for each switching leg to prevent current from commutating between switching legs, equal dynamic current sharing can be achieved. In some examples, by maximizing dynamic current sharing between the switching legs, the efficiency of the power switching circuit 200 may be improved. In addition, equal dynamic current sharing between the switching legs 208 and 210 may reduce or eliminate ringing, oscillations, and overshoots during operation of the power switching circuit 200.

It should be appreciated that embodiments described herein are not limited to a particular method of establishing conduction path lengths and/or inductances to achieve independent conduction paths for each switching leg (e.g., 208 and 210). As discussed above, the GaN devices 212, 222, 232, and 242 may be physically arranged on a PCB (e.g., 302) to establish different conduction path lengths and corresponding conduction path inductances; however, in other examples different methods of establishing various conduction path lengths and inductances may be utilized. For example, characteristics of conduction paths may be controlled by modifying properties of electrical traces and/or vias included on the PCB 302.

Figure 5A:
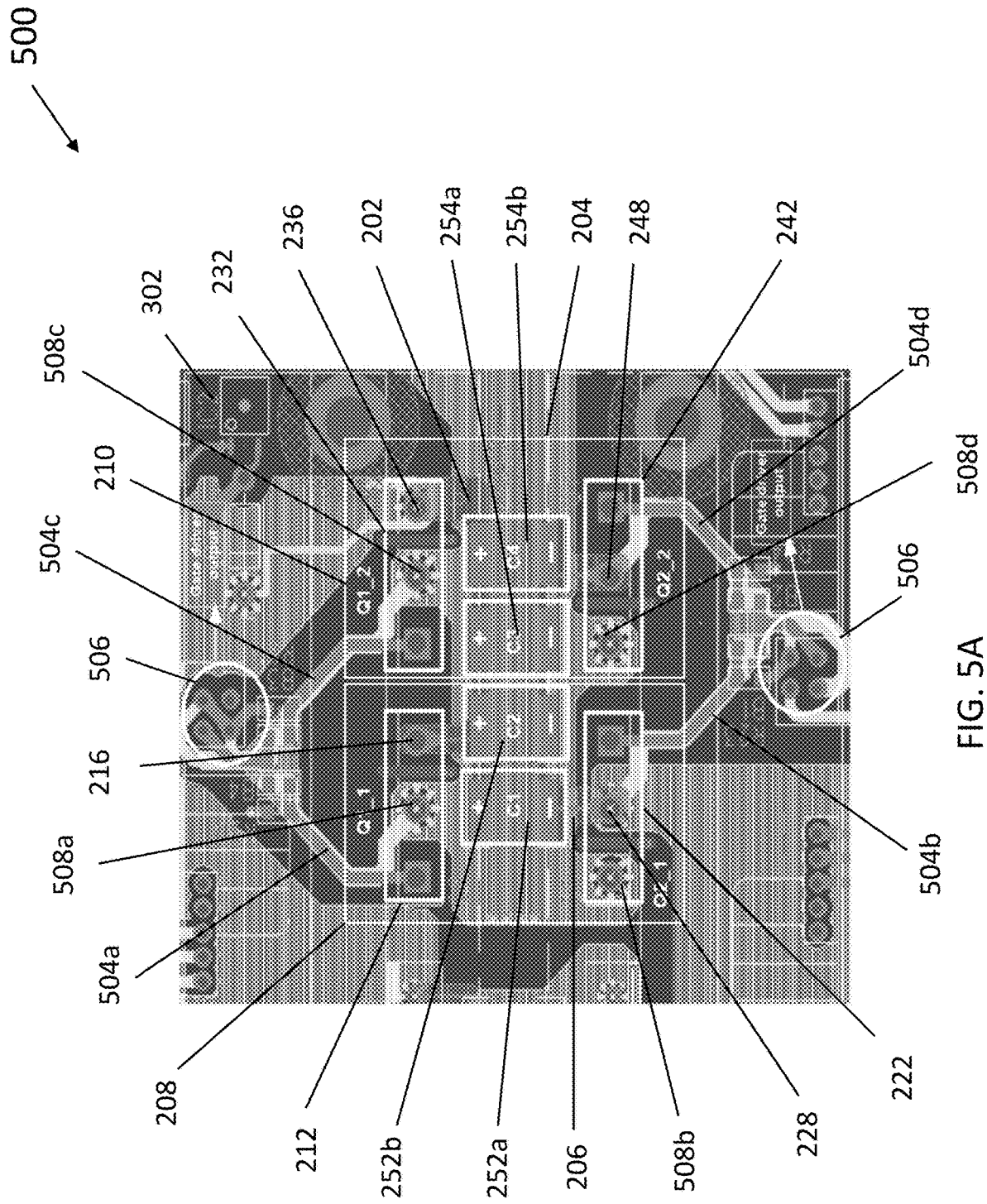
FIG. 5A is a diagram of a power switching assembly in accordance with one embodiment of the present invention.

In addition, embodiments discussed herein are not limited to a particular type of GaN device or device package. For example, FIG. 5A illustrates an example of a power switching assembly layout 500 including the power switching circuit 200 arranged on the PCB 302. In one example, the power switching assembly layout 500 may be similar to the power switching assembly 300 of FIGS. 3A and 3B with the GaN devices 212, 222, 232, and 242 being provided in through-hole packages. As discussed above, the GaN devices may be arranged on the top (i.e., first) layer 304 of the PCB 302 such that GaN devices of the same switching leg (e.g., 208 or 210) are positioned closer to one another than to the GaN devices of the other switching leg. As such, conduction paths between GaN devices of the same switching leg may have a lower inductance than conduction paths between GaN devices of different switching legs.

As discussed above, such arrangements may allow the GaN devices to be positioned symmetrically on the PCB 302. For example, the GaN devices 212, 222 of the first inverter leg 208 may be arranged symmetrically to the GaN devices 232, 242 of the second inverter leg 210. As shown in FIG. 5A, by symmetrically arranging the GaN devices on the PCB 302, the lengths of gate drive conduction paths 504a, 504b, 504c, and 504d between a gate driver output(s) 506 and the gate of each GaN device may be substantially the same (e.g., within 10%). In one example, being that each gate drive conduction path may have substantially the same length, each gate drive conduction path may have substantially the same inductance. In some examples, the inductance of each gate drive conduction path may correspond to the PCB parasitic gate inductances 215b, 225b, 235b, and 245b shown in FIG. 2. Being that the inductances of the gate drive conduction paths are substantially the same, gate drive delay between the GaN devices can be minimized, improving the efficiency of the power switching circuit 200. In some examples, the gate drive conduction paths 504a-504d may be included on the first layer 304 or the second layer 306; however, in other examples the gate drive conduction paths may be included on a different layer of the PCB 302, such as a third layer, fourth layer, or any other layer.

In addition, as discussed above, the first switching leg 208 may include the first decoupling capacitor 252a and the second decoupling capacitor 252b coupled between the positive bus 202 and the negative bus 206. Likewise, the second switching leg 212 may include the third decoupling capacitor 254a and the fourth decoupling capacitor 254b coupled between the positive bus 202 and the negative bus 206. As shown in FIG. 5A, the decoupling capacitors 252a, 252b, 254a, and 254b may be arranged on the first layer 304 of the PCB 302 between the GaN devices and above the switching node 204. In some examples, such placement of the decoupling capacitors can provide a local stable DC voltage to each of the GaN devices, effectively nullifying PCB parasitic inductances between the GaN devices, the positive bus 202, and the negative bus 206. For example, the decoupling capacitor 252b may be positioned in proximity to the source 228 of the second GaN device 222 to nullify the PCB parasitic source inductance 229b of the second GaN device 222, and the decoupling capacitor 252a may be positioned in proximity to the drain 216 of the first GaN device 212 to nullify the PCB parasitic drain inductance 217b of the first GaN device 212. Likewise, the decoupling capacitor 254a may be positioned in proximity to the source 248 of the fourth GaN device 242 to nullify the PCB parasitic source inductance 249b of the fourth GaN device 242, and the decoupling capacitor 254b may be positioned in proximity to the drain 236 of the third GaN device 232 to nullify the PCB drain parasitic inductance 237b of the third GaN device 232. In some examples, the positive bus 202 and the negative bus 206 may also be disposed on the first layer 304; however, in other examples the positive bus 202 and the negative bus 206 may disposed on a different layer of the PCB 302.

As shown in FIG. 5A, the source 218 of the first GaN device 212 may be coupled to the switching node 204 using a first via 508a and the drain 226 of the second GaN device 222 may be coupled to the switching node 204 using a second via 508b. Likewise, the source 238 of the third GaN device 232 may be coupled to the switching node 204 using a third via 508c and the drain 246 of the fourth GaN device 242 may be coupled to the switching node 204 using a fourth via 508d. By placing the switching node 204 between the GaN devices and beneath the decoupling capacitors, the inductance of conduction paths between GaN devices of the same switching leg can be further minimized. In some examples, minimizing the inductance between GaN devices of the same switching leg can improve performance of the power switching circuit 200 in high-speed power switching applications.

Figure 5B:
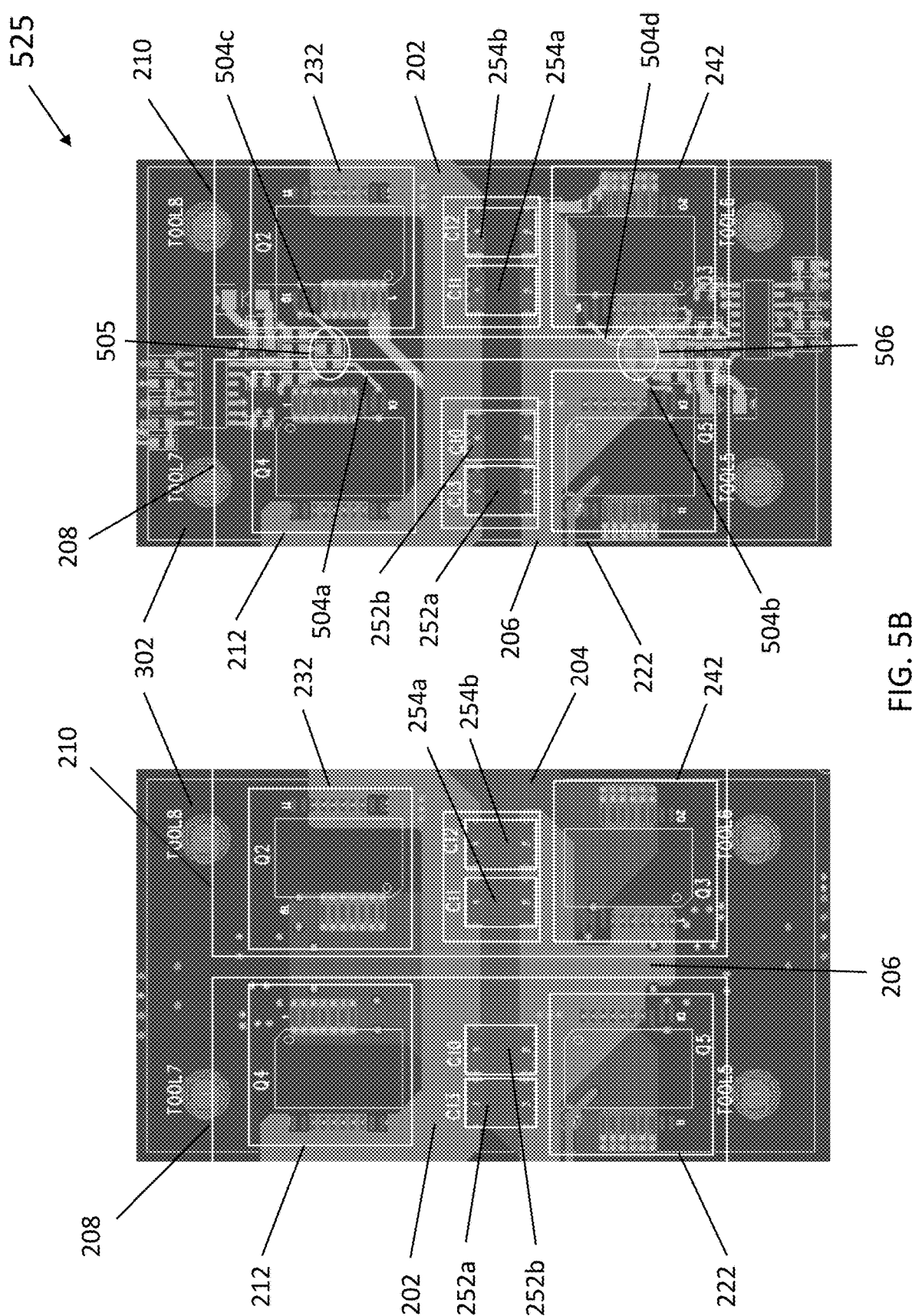
FIG. 5B is a diagram of a power switching assembly in accordance with one embodiment of the present invention.

FIG. 5B illustrates an example of a power switching assembly layout 525 including the power switching circuit 200 arranged on the PCB 302. In one example, the power switching assembly layout 525 may be similar to the power switching assembly 300 of FIGS. 3A and 3B with the GaN devices 212, 222, 232, and 242 being provided in surface mount device (SMD) packages. In some examples, the GaN devices may be provided in various types of SMD packages, including, but not limited to, flat packages, small outline packages, and grid arrays (e.g., ball grid and column grid). Similar to the power switching assembly layout 500 of FIG. 5A, the GaN devices are arranged on the first layer 304 of the PCB 302 such that conduction paths between GaN devices of the same switching leg (e.g., 208 or 210) are shorter than conduction paths between GaN devices of different switching legs. As such, the conduction paths between GaN devices of the same switching leg may have a lower inductance than the conduction paths between GaN devices of different switching legs.

Similar to the power switching assembly layout 500, the switching node 204 of the power switching assembly layout 525 may be disposed on the second layer 306 of the PCB 302. The power switching assembly layout 525 also includes the decoupling capacitors 252a, 252b, 254a, and 254b coupled between the positive bus 202 and the negative bus 206 and arranged on the first layer 304 of the PCB 302 between the GaN devices and above the switching node 204. In addition, the GaN devices are arranged symmetrically on the PCB 302 and oriented such that the gate drive conduction paths 504a-504d may have substantially the same length, minimizing gate drive delay between the GaN devices. In some examples, the gate drive conduction paths 504a-504d may be included on the first layer 304 or the second layer 306; however, in other examples the gate drive conduction paths may be included on a different layer of the PCB 302, such as a third layer, fourth layer, or any other layer.

As described above, the examples provided herein may be implemented using GaN FETs each having gate, drain, and source terminals; however, in other examples different types of GaN devices having different device terminals may be used. For example, the examples provided herein may be implemented using GaN BJTs each having base, collector, and emitter terminals. In other examples, different types of GaN devices may be used such as GaN HEMTs and IGBTs. In some examples, devices of semiconductor materials other than GaN may be used, such as Silicon (Si) devices, Gallium Arsenide (GaAs) devices, etc.

In addition, embodiments discussed herein are not limited to a particular type of power switching circuit and may be advantageously used in a variety of power switching circuits with parallel GaN devices. As discussed above, the power switching circuit 200 may be configured as a half-bridge inverter having a first switching leg 208 and a second switching leg 210. However, in other examples, the power switching circuit 200 may be configured differently. For example, the power switching circuit 200 may be configured as a half-bridge converter, a full-bridge inverter, or any other type of power conversion circuitry including parallel GaN devices. As discussed above, the power switching circuit 200 may be included in power conversion circuitry of a UPS similar to the UPS 100 of FIG. 1. In addition, the power switching circuit 200 may be configured to have more than two switching legs.

As described above, a more efficient and reliable PCB structure for parallel GaN devices is provided herein. In at least one embodiment, parallel GaN devices are arranged such that each switching leg of a power switching circuit maintains an independent conduction path. By maintaining independent conduction paths for each switching leg of the power switching circuit, maximum dynamic current sharing between the parallel GaN devices can be achieved, reducing voltage overshoots and current oscillations, and improving the efficiency of the power switching circuit, especially in high-power applications.

Having thus described several aspects of at least one embodiment of this invention, it is to be appreciated various alterations, modifications, and improvements will readily occur to those skilled in the art. Such alterations, modifications, and improvements are intended to be part of this disclosure and are intended to be within the spirit of and scope of this invention. Accordingly, the foregoing description and drawings are by way of example only.

What is claimed is:

1. An electrical-converter system, comprising:
   a printed circuit board including at least a first layer and a second layer;
   a switching node disposed on the second layer;
   a first transistor, a second transistor, a third transistor, and a fourth transistor disposed on the first layer, the first transistor and the third transistor each having a source coupled to the switching node, and the second transistor and the fourth transistor each having a drain coupled to the switching node;
   a first conduction path from the source of the first transistor, through the switching node, to the drain of the fourth transistor, the first conduction path having a first length; and
   a second conduction path from the source of the first transistor, through the switching node, to the drain of the second transistor, the second conduction path having a second length,
   wherein the first length of the first conduction path is greater than the second length of the second conduction path.

2. The electrical-converter system of claim 1, further comprising a third conduction path from the source of the third transistor, through the switching node, to the drain of the second transistor, the third conduction path having a third length, and a fourth conduction path from the source of the third transistor, through the switching node, to the drain of the fourth transistor, the fourth conduction path having a fourth length,
   wherein the third length of the third conduction path is greater than the fourth length of the fourth conduction path.

3. The electrical-converter system of claim 2, wherein the transistors are positioned on the first layer symmetrically such that a first distance between the first and second transistors is substantially the same as second distance between the third and fourth transistors, and a third distance between the first and third transistors is substantially the same as a fourth distance between the second and fourth transistors.

4. The electrical-converter system of claim 3, wherein the first length of the first conduction path is substantially the same as the third length of the third conduction path and the second length of the second conduction path is substantially the same as the fourth length of the fourth conduction path.

5. The electrical-converter system of claim 4, further comprising a plurality of gate drive outputs and a plurality of gate drive conduction paths between the plurality of gate drive outputs and gates of the first, second, third, and fourth transistors,
   wherein each of the plurality of gate drive conduction paths has substantially the same length.

6. The electrical-converter system of claim 1, further comprising a positive bus and a negative bus disposed on the first layer,
   wherein a drain of the first transistor and a drain of the third transistor are coupled to the positive bus and a source of the second transistor and a source of the fourth transistor are coupled to the negative bus.

7. The electrical-converter system of claim 6, further comprising a plurality of decoupling capacitors coupled between the positive bus and the negative bus and disposed on the first layer between the transistors and above the switching node.

8. The electrical-converter system of claim 1, wherein each of the transistors are Gallium Nitride (GaN) power transistors.

9. The electrical-converter system of claim 8, wherein the GaN power transistors are provided in one of a through-hole device package and a surface mount device package.

10. An electrical-converter system, comprising:
    a printed circuit board including at least a first layer and a second layer;
    a switching node disposed on the second layer;
    a first transistor, a second transistor, a third transistor, and a fourth transistor disposed on the first layer, the first transistor and the third transistor each having a source coupled to the switching node, and the second transistor and the fourth transistor each having a drain coupled to the switching node;
    a first conduction path from the source of the first transistor, through the switching node, to the drain of the fourth transistor, the first conduction path having a first inductance; and
    a second conduction path from the source of the first transistor, through the switching node, to the drain of the second transistor, the second conduction path having a second inductance,
    wherein the first inductance of the first conduction path is greater than the second inductance of the second conduction path.

11. The electrical-converter system of claim 10, further comprising a third conduction path from the source of the third transistor, through the switching node, to the drain of the second transistor, the third conduction path having a third inductance, a fourth conduction path from the source of the third transistor, through the switching node, to the drain of the fourth transistor, the fourth conduction path having a fourth inductance,
    wherein the third inductance of the third conduction path is greater than the fourth inductance of the fourth conduction path.

12. The electrical-converter system of claim 11, wherein the transistors are positioned on the first layer symmetrically such that a first distance between the first and second transistors is substantially the same as a second distance between the third and fourth transistors, and a third distance between the first and third transistors is substantially the same as a fourth distance between the second and fourth transistors.

13. The electrical-converter system of claim 12, wherein the first inductance of the first conduction path is substantially the same as the third inductance of the third conduction path and the second inductance of the second conduction path is substantially the same as the fourth inductance of the fourth conduction path.

14. The electrical-converter system of claim 13, further comprising a plurality of gate drive outputs and a plurality of gate drive conduction paths between the plurality of gate drive outputs and gates of the first, second, third, and fourth transistors,
    wherein each of the plurality of gate drive conduction paths have substantially the same length.

15. The electrical-converter system of claim 10, further comprising a positive bus and a negative bus disposed on the first layer,
    wherein a drain of the first transistor and a drain of the third transistor are coupled to the positive bus and a source of the second transistor and a source of the fourth transistor are coupled to the negative bus.

16. The electrical-converter system of claim 15, further comprising a plurality of decoupling capacitors coupled between the positive bus and the negative bus and disposed on the first layer between the transistors and above the switching node.

17. The electrical-converter system of claim 10, wherein each of the transistors are Gallium Nitride (GaN) power transistors.

18. The electrical-converter system of claim 17, wherein the GaN power transistors are provided in one of a through-hole device package and a surface mount device package.

19. A method for manufacturing an electrical-converter system, the method comprising:
providing a printed circuit board having at least a first layer and a second layer with a switching node disposed on the second layer;
arranging a first transistor, a second transistor, a third transistor, and a fourth transistor on the first layer of the printed circuit board in proximity to the switching node; and
coupling a source of the first transistor, a drain of the second transistor, a source of the third transistor, and a drain of the fourth transistor to the switching node such that a first length of a first conduction path from the source of the first transistor, through the switching node, to the drain of the fourth transistor is greater than a second length of a second conduction path from the source of the first transistor, through the switching node, to the drain of the second transistor.

20. The method of claim 19, further comprising arranging a plurality of decoupling capacitors on the first layer between the transistors and above the switching node.

21. The method of claim 20, further comprising coupling the decoupling capacitors between a positive bus and a negative bus disposed on the first layer.

22. The method of claim 19, wherein arranging the transistors on the first layer further includes positioning the transistors symmetrically such that a first distance between the first and second transistors is substantially the same as a second distance between the third and fourth transistors, and a third distance between the first and third transistors is substantially the same as a fourth distance between the second and fourth transistors.

23. The method of claim 22, further comprising coupling gates of the first, second, third, and fourth transistors to a plurality of gate driver outputs such that the length of each conduction path between the plurality of gate driver outputs and the transistor gates is substantially the same.

* * * * *